(12) United States Patent
Park et al.

(10) Patent No.: US 10,658,506 B2
(45) Date of Patent: May 19, 2020

(54) FIN CUT LAST METHOD FOR FORMING A VERTICAL FINFET DEVICE

(71) Applicant: GLOBALFOUNDRIES INC., Grand Cayman (KY)

(72) Inventors: Chanro Park, Clifton Park, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/038,265

(22) Filed: Jul. 18, 2018

(65) Prior Publication Data
US 2020/0027981 A1    Jan. 23, 2020

(51) Int. Cl.
| | |
|---|---|
| H01L 29/78 | (2006.01) |
| H01L 29/66 | (2006.01) |
| H01L 29/06 | (2006.01) |
| H01L 21/768 | (2006.01) |
| H01L 21/762 | (2006.01) |
| H01L 21/8234 | (2006.01) |

(52) U.S. Cl.
CPC .... *H01L 29/7827* (2013.01); *H01L 21/76283* (2013.01); *H01L 21/76829* (2013.01); *H01L 21/823468* (2013.01); *H01L 29/0649* (2013.01); *H01L 29/6656* (2013.01); *H01L 29/66666* (2013.01)

(58) Field of Classification Search
CPC ..................................................... H01L 29/165
See application file for complete search history.

(56) References Cited

U.S. PATENT DOCUMENTS

| | | | |
|---|---|---|---|
| 8,502,316 B2 * | 8/2013 | Fung | H01L 21/26506 257/350 |
| 9,589,845 B1 | 3/2017 | Jagannathan et al. | |
| 9,673,199 B1 | 6/2017 | Anderson et al. | |
| 9,704,754 B1 | 7/2017 | Bao et al. | |
| 9,818,875 B1 | 11/2017 | Bi et al. | |
| 9,899,515 B1 | 2/2018 | Cheng et al. | |
| 10,056,289 B1 * | 8/2018 | Cheng | H01L 21/823487 |
| 10,297,668 B1 * | 5/2019 | Lee | H01L 29/0847 |
| 2018/0294192 A1 * | 10/2018 | Bao | H01L 21/82345 |
| 2019/0319118 A1 * | 10/2019 | Lee | H01L 21/02255 |

* cited by examiner

*Primary Examiner* — Caridad Everhart
*Assistant Examiner* — Ankush K Singal
(74) *Attorney, Agent, or Firm* — David Cain; Hoffman Warnick LLC

(57) ABSTRACT

A fin cut last methodology for manufacturing a vertical FinFET includes forming a plurality of semiconductor fins over a substrate, forming shallow trench isolation between active fins and, following the formation of a functional gate of the active fins, using a selective etch to remove a sacrificial fin from within an isolation region. A further etching step can be used to remove a portion of the gate stack proximate to the sacrificial fin to create an isolation trench and a laterally-extending cavity within the isolation region that are back-filled with an isolation dielectric.

16 Claims, 13 Drawing Sheets

FIN CUT LAST METHOD FOR FORMING A VERTICAL FINFET DEVICE

BACKGROUND

The present application relates generally to semiconductor devices, and particularly to vertical fin field effect transistors (V-FinFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

Vertical FETs are devices where the source-drain current flows in a direction normal to the substrate surface. In vertical FinFET devices, the fin defines the transistor channel with the source and drain regions located at opposing (i.e., upper and lower) ends of the fin.

A challenge associated with a vertical FET architecture is precise control of the fidelity of a fin cut, e.g., to form discrete devices amongst plural segments of an incumbent fin. In various conventional approaches, such as a fin cut first approach, successive masking and etching steps are used to form a fin-defining hard mask over a semiconductor substrate, selectively remove unwanted portions of the hard mask, and then etch the semiconductor substrate using the patterned hard mask as an etch mask to form a plurality of cut fins. In addition to the challenge of accurately locating the resulting fins, i.e., within designated active regions of the substrate, the thickness of the hard mask used to define the fins can challenge the formation of fins with the desired geometry, including substantially vertical sidewalls. Accordingly, it would be advantageous to provide a robust, vertical FinFET manufacturing process and associated structure that are compatible with existing circuit designs, while enabling precise dimensional control of severed fins.

SUMMARY

In accordance with embodiments of the present application, a method of forming a vertical FinFET device includes forming a plurality of fins including a sacrificial fin over a semiconductor substrate, forming a bottom source/drain region over the semiconductor substrate and adjacent to the fins, and forming a shallow trench isolation layer within an isolation region of the semiconductor substrate and directly adjacent to sidewalls of the sacrificial fin.

In certain embodiments, a bottom spacer is formed over the bottom source/drain region and over the shallow trench isolation layer, and a gate stack including a conformal gate dielectric layer is formed over the bottom spacer and over sidewalls of the fins. A first dielectric layer is thereafter formed over the gate stack. The method further includes selectively removing the sacrificial fin from within the isolation region to form a trench, etching portions of the gate stack exposed within the trench to form a cavity, and forming an isolation dielectric layer within the trench and within the cavity.

According to further embodiments, a vertical FinFET structure includes a fin disposed over a semiconductor substrate, a bottom source/drain region disposed over the semiconductor substrate, where a lower portion of the fin is in contact with the bottom source/drain region, a bottom spacer disposed over the bottom source/drain region, and an isolation structure including an isolation dielectric layer disposed between the pair of fins. The isolation structure includes a lower portion having a first width that extends vertically through the bottom spacer into the substrate and between the bottom source/drain region of each fin, and a middle portion above the bottom portion, wherein the middle portion extends laterally over the bottom spacer and has a second width greater than the first width.

According to certain embodiments, the vertical FinFET structure also includes a top spacer disposed over the gate stack, a first dielectric layer disposed over the top spacer, and a top source/drain region disposed over an upper portion of the fin.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
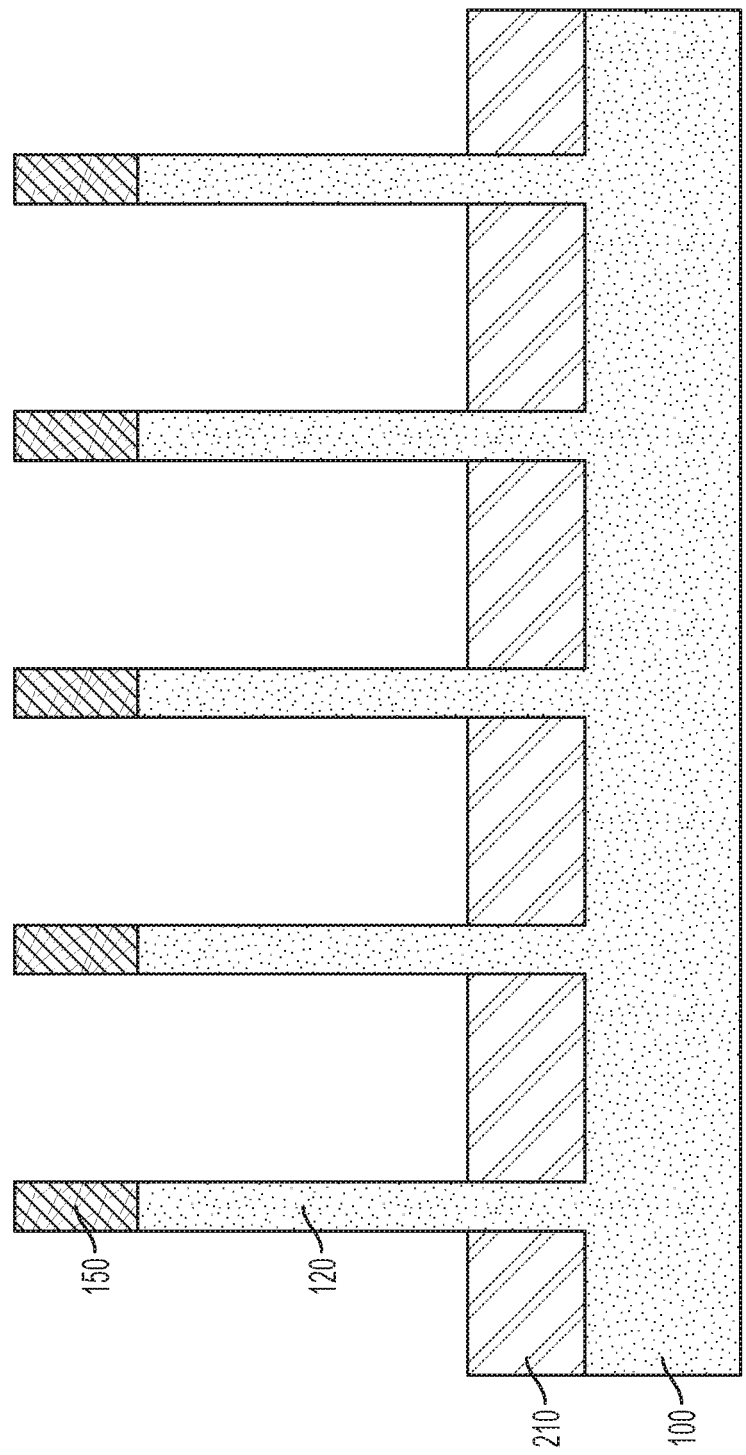
FIG. 1 is a simplified schematic diagram of an example vertical fin field effect transistor at an intermediate stage of fabrication showing a plurality of semiconductor fins with overlying hard masks formed over a semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

Embodiments of the application relate generally to the manufacture of semiconductor devices, and more particularly to the manufacture of vertical fin field effect transistors (V-FinFETs). Exemplary devices include vertical fin field effect transistors where a fin cut module and the attendant formation of an isolation structure between active device regions follows the formation of bottom source/drain regions and the formation of functional gates over the fins within the active device regions. As will be appreciated, the delayed fin cut can be performed using a selective etch that forms a self-aligned isolation trench within an isolation region of the substrate between active regions. An isolation dielectric layer can be deposited within the trench to electrically isolate adjacent active regions.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Reference will now be made to FIGS. 1-13, which together with the following description, provide an exemplary method for manufacturing a vertical FinFET using a fin cut last process. In such a process, a fin cut module is delayed until after fin formation and additional processing, including the formation of a functional gate over uncut fins.

With reference to FIG. 1, as shown in cross-section, a vertical FinFET device at an intermediate stage of fabrication includes a semiconductor substrate 100 having a plurality of fins 120 formed thereon. In several embodiments, the fins 120 are etched from, and therefore contiguous with the semiconductor substrate 100. Substrate 100 may include a semiconductor material such as silicon or a silicon-containing material, and may be a bulk substrate or a hybrid substrate such as a semiconductor-on-insulator (SOI) substrate.

Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The semiconductor substrate 100 is not limited to silicon-containing materials, however, as the semiconductor substrate 100 may include other semiconductor materials, including Ge and compound semiconductors, including III-V compound semiconductors such as GaAs, InAs, GaN, GaP, and InSb, and II-VI compound semiconductors such as CdSe, CdS, CdTe, ZnSe, ZnS and ZnTe.

In the illustrated embodiment, semiconductor substrate 100 may be a bulk silicon substrate. In alternate embodiments, the semiconductor substrate 100 may be an SOI substrate that includes, from bottom to top, a handle portion, an isolation layer, and a semiconductor material layer. In the illustrated embodiment, only the topmost semiconductor material layer of such a substrate is shown.

Substrate 100 may have dimensions as typically used in the art and may include, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may include (100)-oriented silicon or (111)-oriented silicon, for example.

Semiconductor fins 120 may be defined by a patterning process such as a photolithographic process, which includes forming a hard mask 150 over the substrate and forming a layer of photoresist material (not shown) atop the hard mask 150. Hard mask 150 may include a material such as, for example, silicon nitride or silicon oxynitride, and may be deposited using conventional deposition processes, such as, for example, CVD or plasma-enhanced CVD (PECVD).

The deposited photoresist is then subjected to a pattern of irradiation, and the exposed photoresist material is developed utilizing a conventional resist developer. In the instant embodiment, this provides a patterned layer of photoresist atop the hard mask 150, which is disposed over a top surface of the semiconductor substrate 100. The pattern provided by the patterned photoresist material is thereafter transferred into the underlying material layer or material layers (e.g., hard mask 150 and semiconductor substrate 100) utilizing at least one pattern transfer etching process.

Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps.

In particular embodiments, the hard mask 150 includes a layer of silicon dioxide and an overlying layer of silicon nitride. For example, the hard mask 150 may include a layer of silicon dioxide disposed directly over the top surfaces of the fins 120, and a layer of silicon nitride disposed directly over the layer of silicon dioxide.

As known to those skilled in the art, according to further embodiments, the fin formation process may alternatively include a sidewall image transfer (SIT) process or a double patterning (DP) process.

Each of the fins 120 may have a height (h) ranging from 5 nm to 100 nm, e.g., 5, 10, 20, 50, or 100 nm, including ranges between any of the foregoing values, and width (w) of less than 20 nm, e.g., 3, 5, 8, 10, 12 or 15 nm, including ranges between any of the foregoing values. Thus, the fins 120 define an inter-fin spacing (S) or gap between sidewalls of adjacent fins. The pitch (d), i.e., repeat distance, between adjacent fins 120 may range from 10 nm to 60 nm, e.g., 10, 20, 30, 40, 50 or 60 nm, including ranges between any of the foregoing values, where d=S+w. Although five fins are shown, the present disclosure is not limited to only this example. It is noted that any number of fins 120 may be formed over the semiconductor substrate 100. According to various embodiments, plural fins are typically oriented parallel to each other and perpendicular to the library logic flow of a circuit. At this stage of manufacture, the fins 120 are uncut.

A bottom source/drain region 210 is disposed over and/or within the substrate proximate to a lower portion of each fin 120. Bottom source/drain region 210 may be formed adjacent to the fins by selective epitaxial growth from semiconductor substrate 100 or by ion implantation.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and retain sufficiently mobile via surface diffusion to orient themselves according to the crystalline orientation of the atoms of the deposition surface.

Example epitaxial growth processes include low energy plasma deposition, liquid phase epitaxy, molecular beam epitaxy, and atmospheric pressure chemical vapor deposition. An example silicon epitaxial process uses a gas mixture including $H_2$ and silane ($SiH_4$) or dichlorosilane ($SiH_2Cl_2$) at a deposition (e.g., substrate) temperature of 450-800° C. and a growth pressure (i.e., chamber pressure) of 0.1-700 Torr.

The foregoing processes may be modified to form a silicon germanium ($SiGe_x$) epitaxial bottom source/drain region, for example. During such a process, a germanium source such as germane gas ($GeH_4$) flows concurrently into a process chamber with a silicon source and a carrier gas (e.g., $H_2$ and/or $N_2$). By way of example, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used. By way of example, the germanium content of a silicon germanium ($SiGe_x$) source/drain region 210 may be in the range of 25 to 50 atomic percent.

Figure 2:
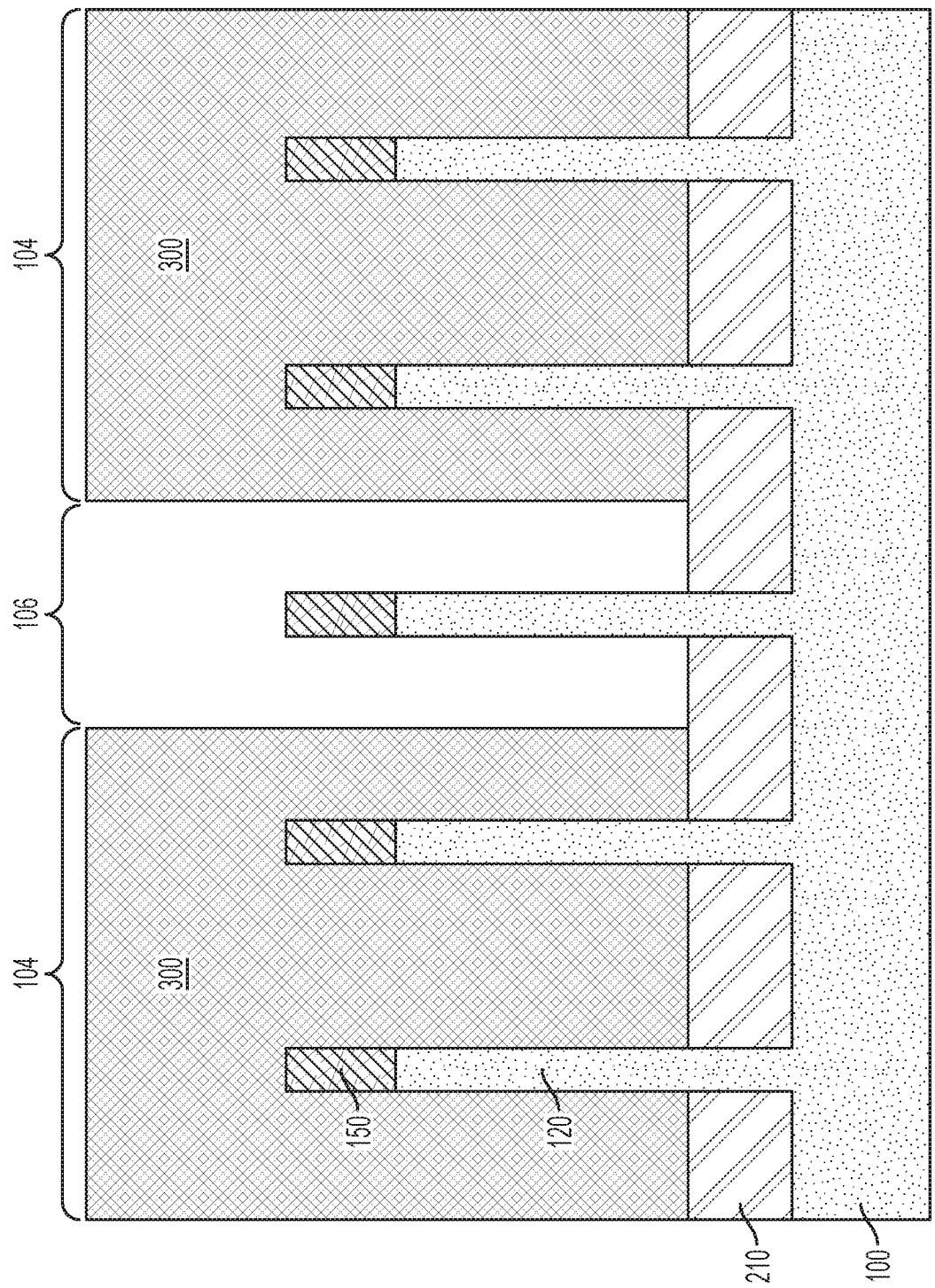
FIG. 2 shows the formation of a block mask over the fins within active regions of the substrate.

Referring to FIG. 2, a block mask layer is formed over the structure of FIG. 1 and the block mask layer is patterned and etched using conventional photolithography techniques to form a block mask 300 over fins 120 within active device regions 104, while fins 120 within isolation region 106 are unmasked. Thus, block mask 300 overlies active device regions 104 of the substrate as well as a plurality of masked fins, whereas unblocked portions of the substrate 100 and an unmasked fin are within the isolation region 106. As will be appreciated, isolation region 106 may also include later-formed structures formed within and overlying the substrate 100.

According to various embodiments, block mask 300 may include an organic planarization layer (OPL) as known to those skilled in the art. In further embodiments, block mask 300 may include a photo-sensitive organic polymer that, when exposed to electromagnetic radiation, is chemically altered and thus configured to be removed using a developing solvent. For instance, a photo-sensitive organic polymer may be include a polyacrylate resin, epoxy resin, phenol resin, polyamide resin, polyimide resin, unsaturated polyester resin, polyphenylenether resin, polyphenylenesulfide resin, or benzocyclobutene.

Figure 3:
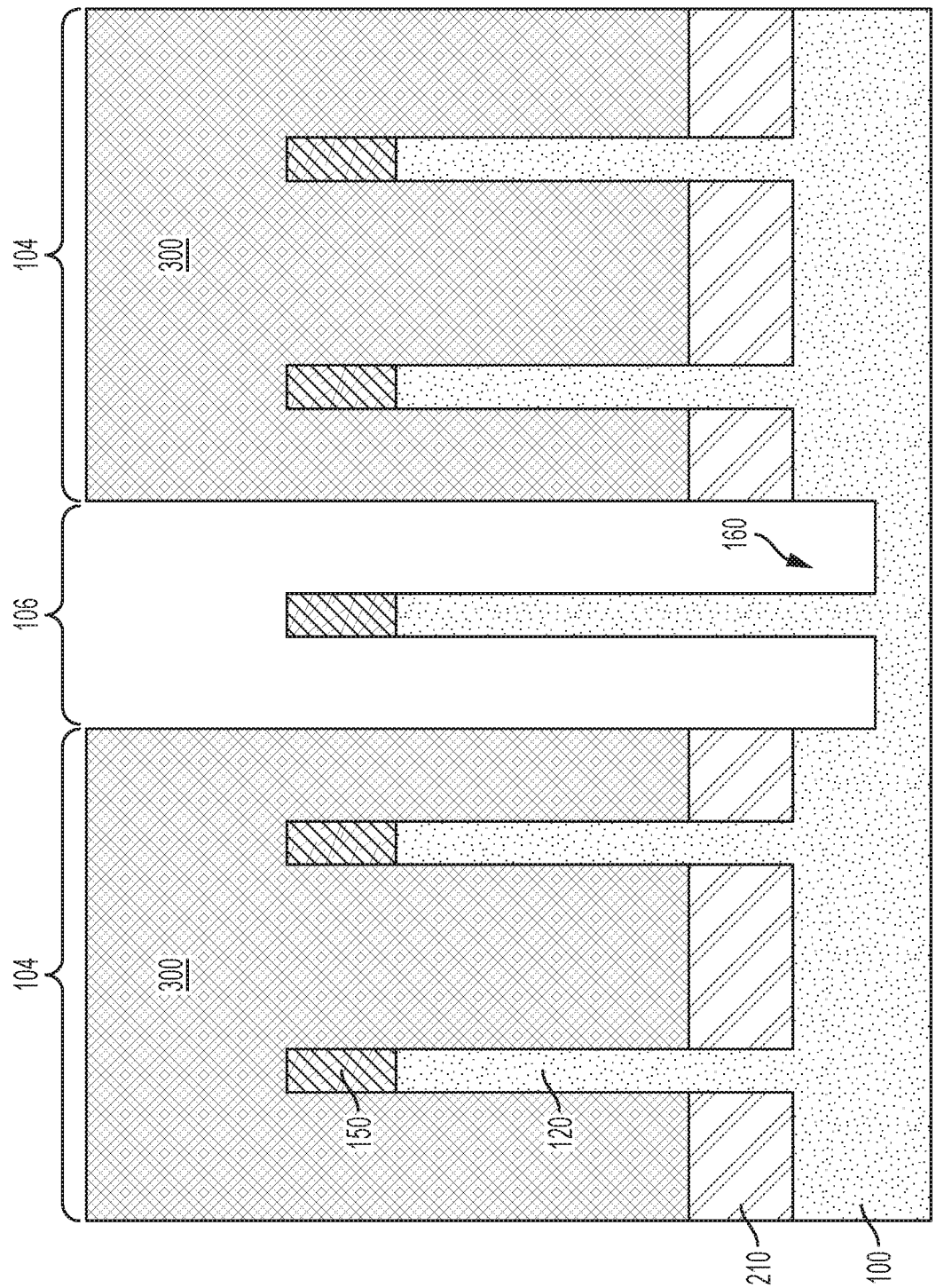
FIG. 3 depicts the formation of an isolation trench within the semiconductor substrate within an isolation region between active regions.
Figure 4:
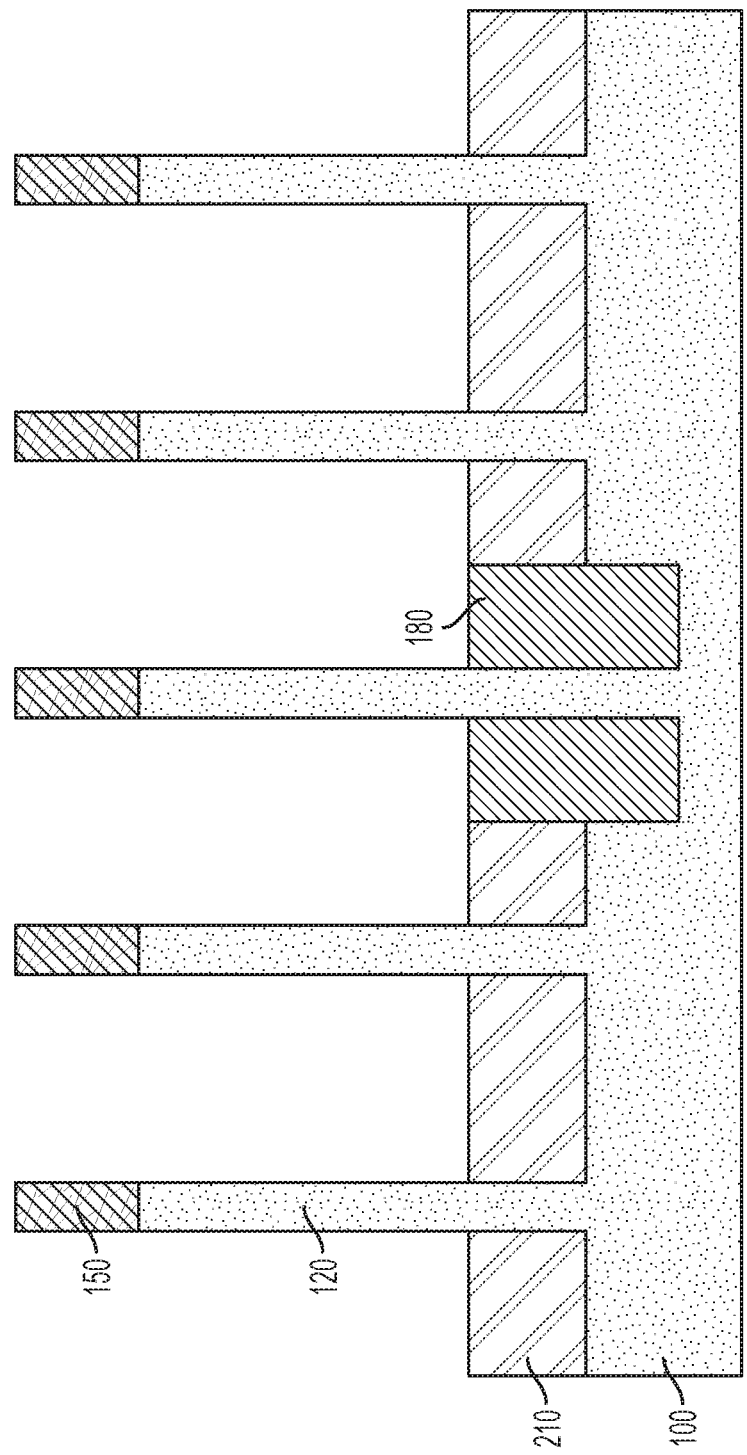
FIG. 4 shows the formation of a shallow trench isolation layer within the isolation trench between active regions.

Referring to FIG. 3, using block mask 300 as an etch mask, a shallow trench isolation (STI) architecture may be formed within semiconductor substrate 100, i.e., between fins 120 and within isolation region 106, by initially etching the semiconductor substrate 100, including bottom source/drain region 210, to form isolation trenches 160, and then backfilling the isolation trenches 160 with a dielectric material such as silicon dioxide. For instance, as shown in FIG. 4, shallow trench isolation (STI) layer 180 is formed within isolation trenches 160 laterally adjacent to a sacrificial fin within the isolation region 106. Shallow trench isolation (STI) layer 180 may be used to provide electrical isolation between the fins 120 located in active regions 104, and between adjacent devices as is needed for the circuit(s) being implemented.

In the illustrated embodiment, a sidewall of the isolation trench 160 and hence a sidewall of the shallow trench isolation layer 180 is coplanar with a sidewall of the sacrificial fin 120 located within the isolation region 106.

Figure 5:
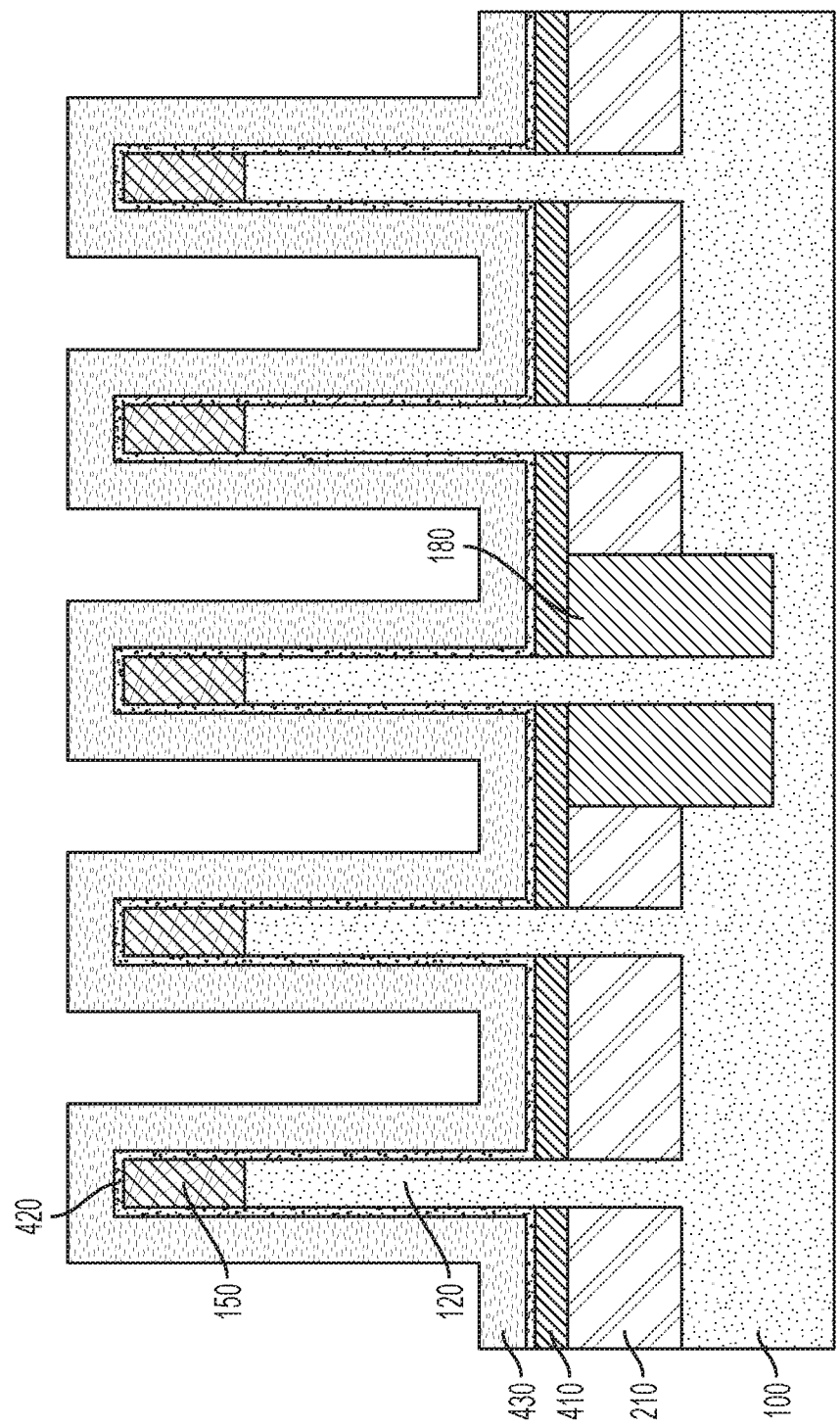
FIG. 5 depicts the formation of a bottom spacer layer and a gate stack including a gate dielectric layer and a gate conductor layer over the fins.

Referring to FIG. 5, a bottom spacer 410 is formed over the shallow trench isolation 180 and over a top surface of the semiconductor substrate 100, including directly over bottom source/drain region 210 between fins 120. In various embodiments, formation of the bottom spacer 410 includes a conformal deposition process followed by the patterned removal of the spacer layer from over the top and sidewall surfaces of the fins 120, e.g., using an organic planarization layer (OPL) as an etch mask. In such embodiments, the protective organic planarization layer (not shown) is deposited over horizontal surfaces of the bottom spacer 410 proximate to the substrate.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

The bottom spacer 410 may include, for example, silicon dioxide ($SiO_2$). Alternatively, bottom spacer 410 may include other dielectric materials such as silicon nitride, silicon oxynitride, a low-k material, or any suitable combination of these materials. The thickness of the bottom spacer 410 may range from 1 to 10 nm, e.g., 1, 2, 5 or 10 nm, including ranges between any of the foregoing values.

As used herein, the compounds silicon dioxide and silicon nitride have compositions that are nominally represented as $SiO_2$ and $Si_3N_4$, respectively. The terms silicon dioxide and silicon nitride refer to not only these stoichiometric compositions, but also to oxide and nitride compositions that deviate from the stoichiometric compositions.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon nitride. Bottom spacer 410 is adapted to isolate the bottom source/drain region 210 from a later-formed gate.

Referring still to FIG. 5, a gate stack is then formed above the bottom spacer 410 and over the tops and sidewalls of the fins 120. The gate stack includes a conformal gate dielectric layer 420 and a gate conductor layer 430, which are deposited in succession. The gate dielectric layer 420 and the gate conductor layer 430 form a functional gate. A "functional gate" is operable to switch a semiconductor device from an "on" state to "off" state, and vice versa.

The gate dielectric layer 420 may be a conformal layer that is formed over exposed surfaces of the fins and over the bottom spacer 410. Gate dielectric 420 may include silicon dioxide, silicon nitride, silicon oxynitride, a high-k dielectric, and/or other suitable material.

As used herein, a high-k material has a dielectric constant greater than that of silicon nitride. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, BaTiO$_3$, LaAlO$_3$, Y$_2$O$_3$, HfO$_x$N$_y$, HfSiO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiO$_x$N$_y$, SiN$_x$, a silicate thereof, and an alloy thereof. Each value of x may independently vary from 0.5 to 3, and each value of y may independently vary from 0 to 2.

The gate dielectric layer 420 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing values. In various embodiments, the gate dielectric 420 includes a thin layer (e.g., 0.5 nm) of silicon dioxide and an overlying layer of high-k dielectric material.

The gate conductor layer 430 is formed over the gate dielectric layer 420. The gate conductor layer 430 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor 430 may include one or more layers of such materials such as, for example, a metal stack including a barrier layer, work function metal layer, and conductive fill layer.

The gate conductor layer 430 may be a conformal layer that is formed directly over the gate dielectric 420. The gate conductor 430 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The gate conductor thickness may range from 5 nm to 50 nm, e.g., 5, 10, 15, 20, 30, 40 or 50 nm, including ranges between any of the foregoing values.

Figure 6:
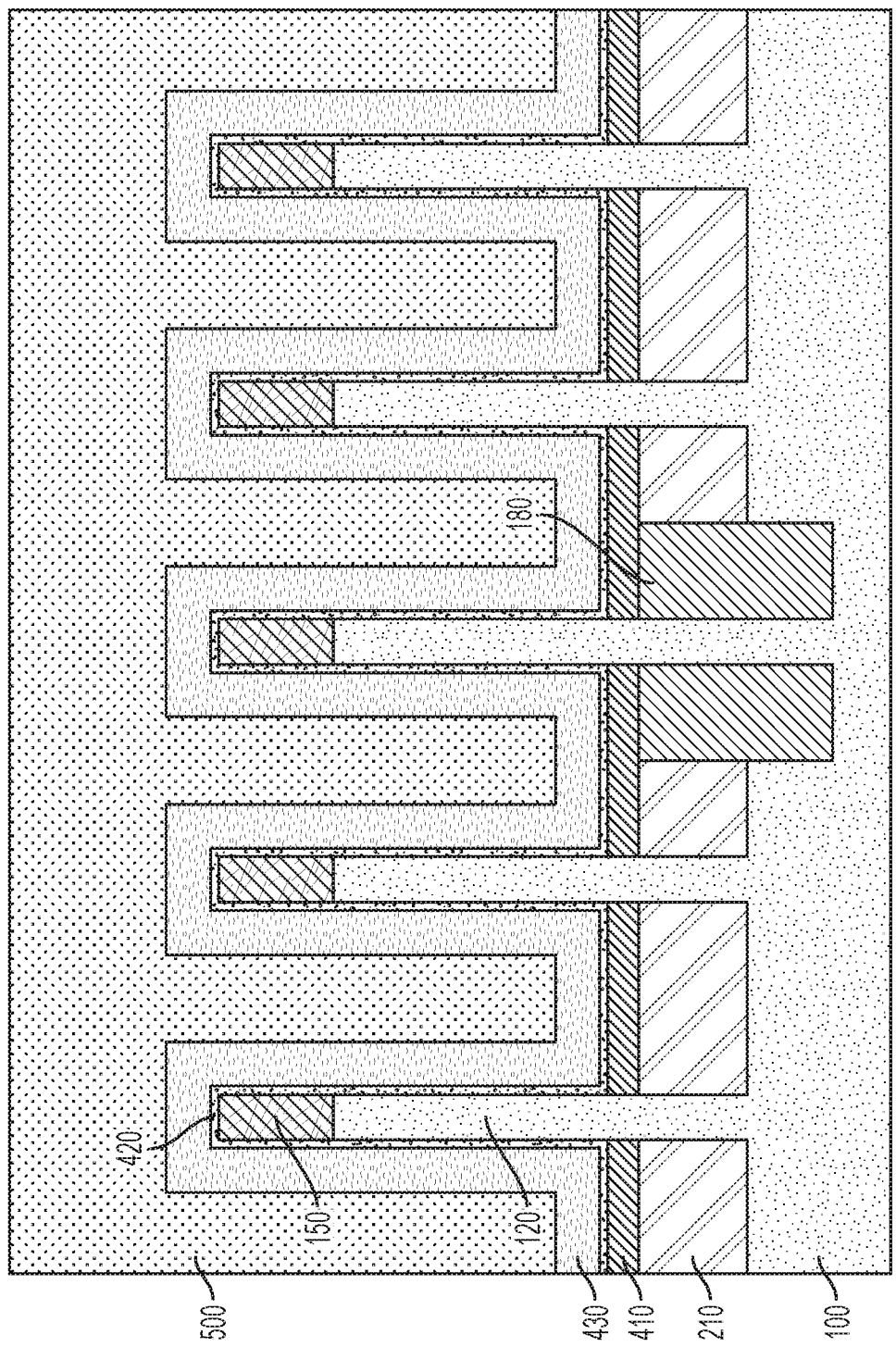
FIG. 6 depicts a planarized architecture after deposition of a gap fill dielectric layer over the device architecture of FIG. 5.
Figure 7:
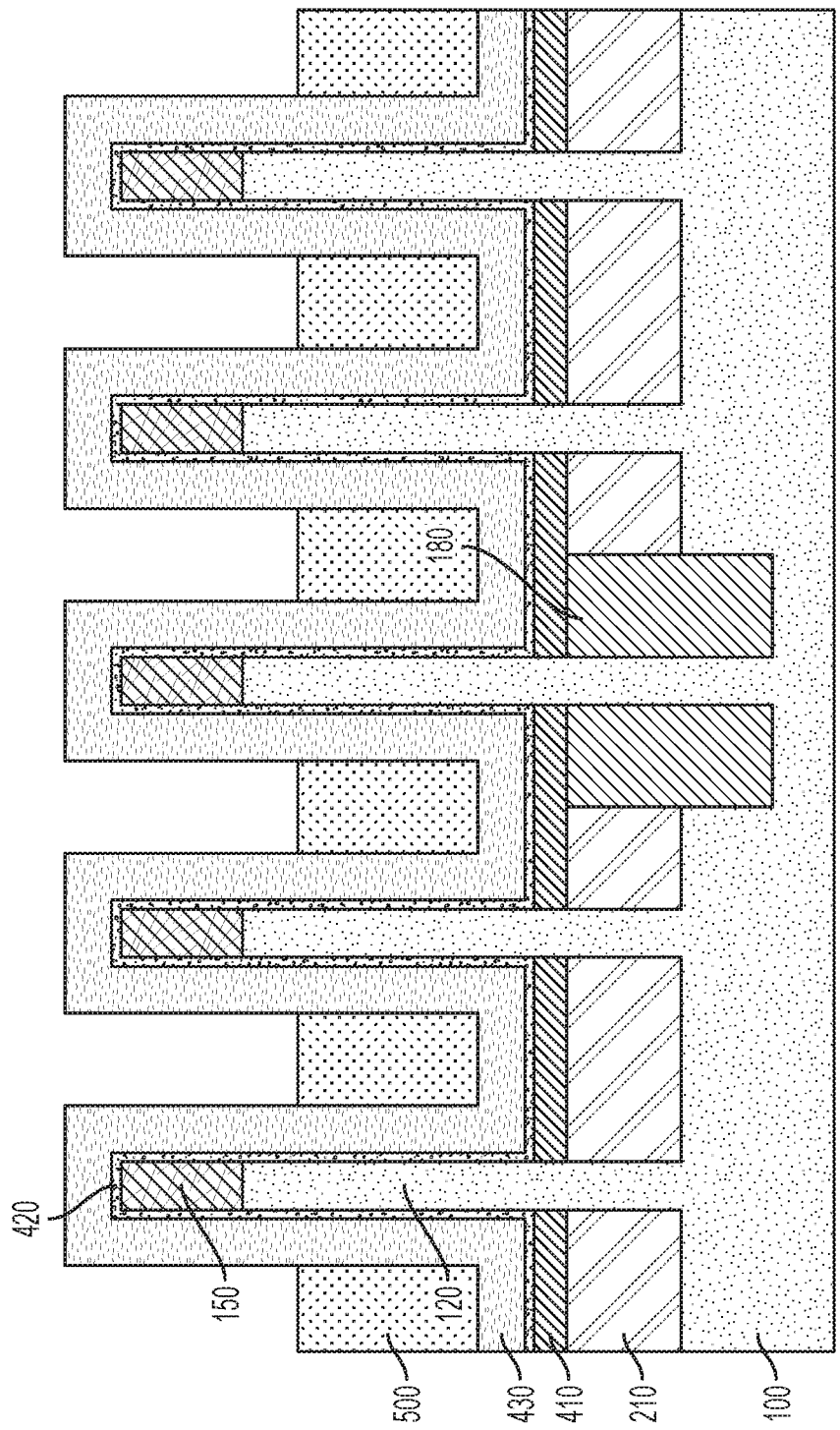
FIG. 7 shows a recess etch of the gap fill dielectric layer.

Referring to FIG. 6, a gap fill layer 500 is deposited over the structure of FIG. 5, i.e., directly over gate conductor layer 430 and between neighboring fins 120. In various embodiments, gap fill layer 500 may include an organic planarization layer (OPL). In various embodiments, the as-deposited gap fill layer thickness is essentially uniform. An etching step is then used to recess the gap fill layer 500, as shown in FIG. 7. Following the recess etching step, a top surface of the gap fill layer 500 may be below a top surface of the fins 120, such that a top portion of the gate conductor layer 430 is exposed.

Figure 8:
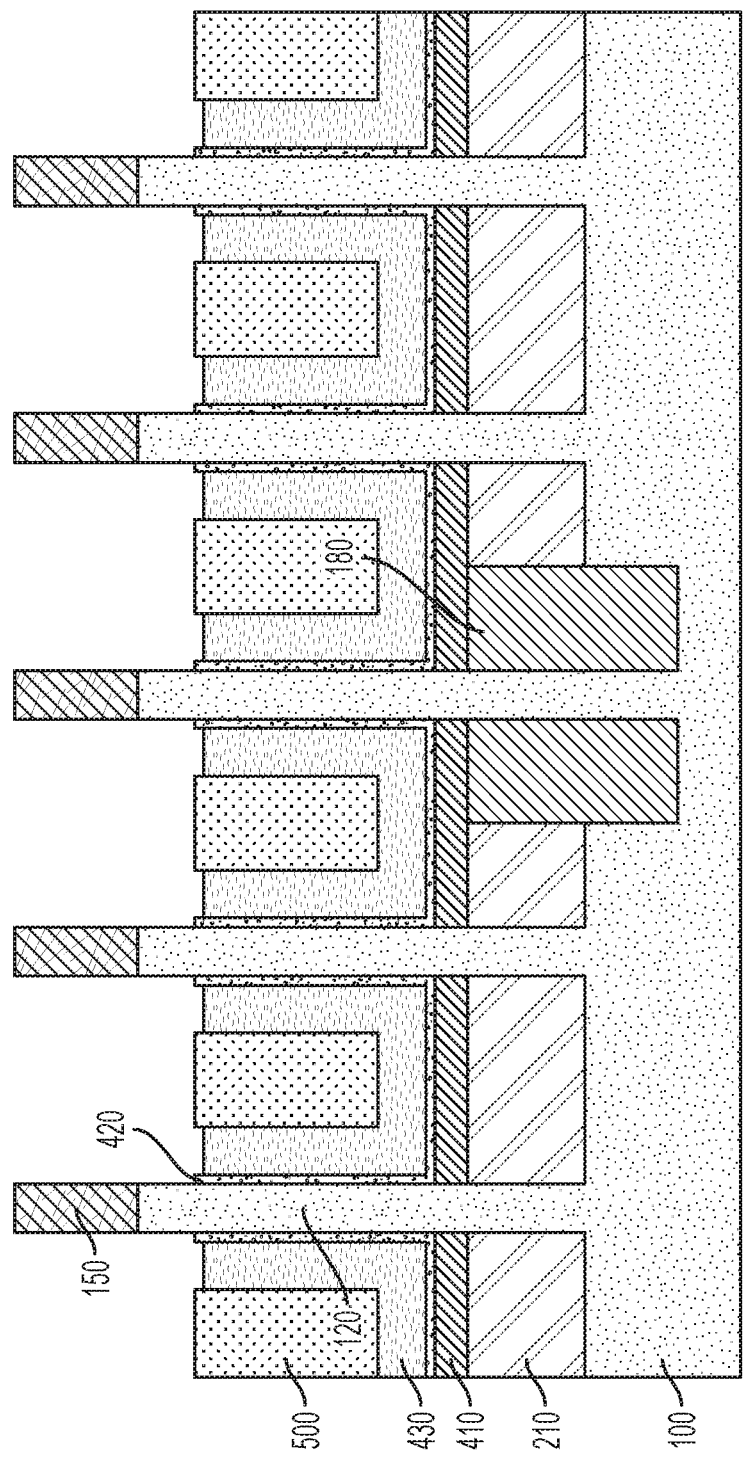
FIG. 8 shows removal of unprotected portions of the gate dielectric and gate conductor layers.

As seen with reference to FIG. 8, recessed gap fill layer 500 is adapted to limit the extent of a subsequent recess etch of the gate dielectric and gate conductor layers 420, 430 to expose hard mask 150 and top regions of the fins 120. In various embodiments, the gate dielectric and gate conductor layers 420, 430 are recessed to a uniform height.

Figure 9:
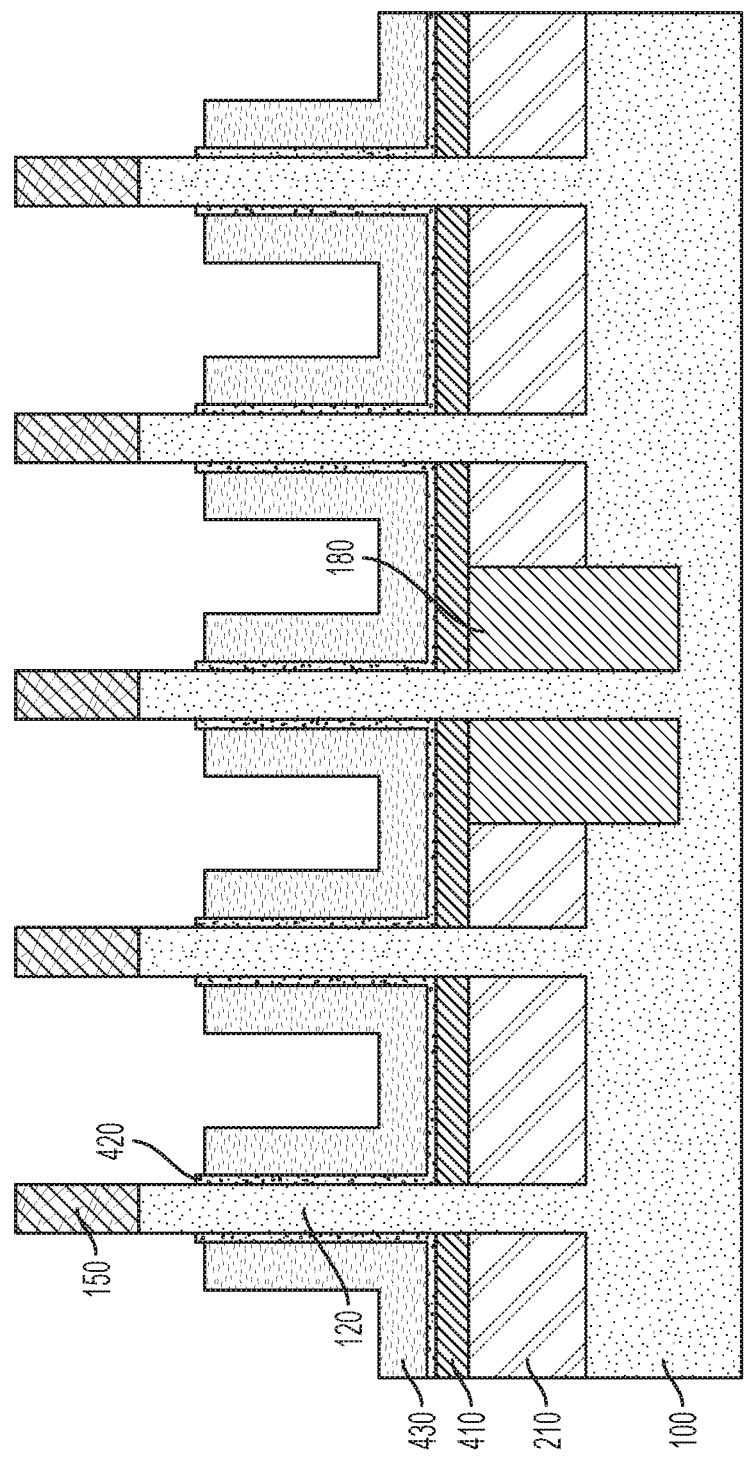
FIG. 9 depicts removal of remaining portions of the gap fill dielectric layer.

The recess etch processes described herein typically include an anisotropic etch. In certain embodiments, a dry etching process such as, for example, reactive ion etching can be used. In other embodiments, a wet chemical etchant can be used. In still further embodiments, a combination of dry etching and wet etching can be used. Referring to FIG. 9, remaining portions of the gap fill layer 500 are removed, e.g., using an ashing step.

Figure 10:
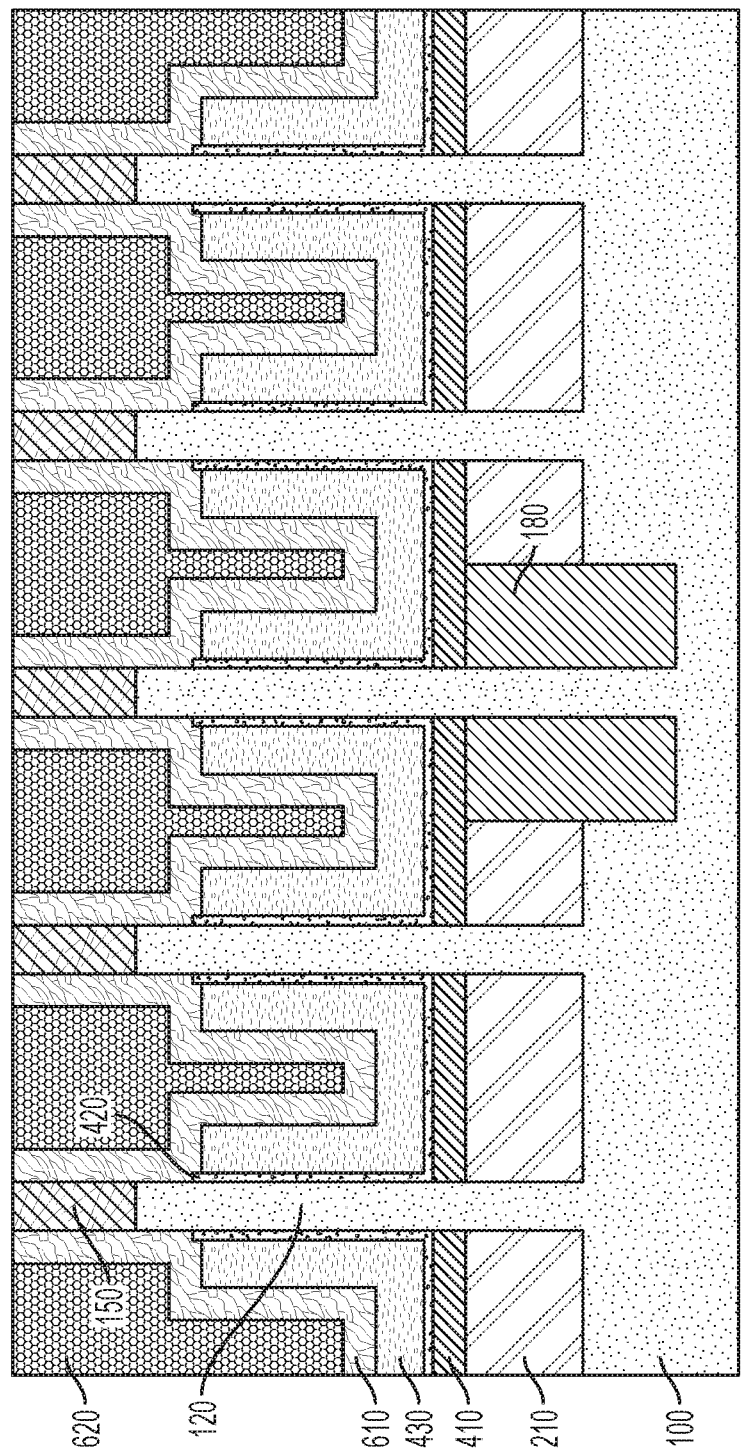
FIG. 10 shows the formation of a conformal top spacer layer and the subsequent formation and planarization of an interlayer dielectric.

Thereafter, referring to FIG. 10, a top spacer layer 610 is formed over the recessed gate stack. In various embodiments, formation of the top spacer layer 610 includes a conformal deposition process such as chemical vapor deposition (CVD), followed by an anisotropic etch to remove the spacer material(s) from horizontal surfaces and expose the fins along top surfaces thereof. In the illustrated embodiment, sidewalls of the fins are exposed above the top spacer layer 610.

The thickness of the top spacer 610 may range from 1 to 10 nm, e.g., 1, 2, 5 or 10 nm, including ranges between any of the foregoing values. The top spacer 610 may include, for example, silicon dioxide (SiO$_2$). Alternatively, top spacer 610 may include other dielectric materials such as silicon nitride, silicon oxynitride, a low-k material, or any suitable combination of these materials. Top spacer layer 610 is adapted to isolate the top source/drain region from the gate of the transistor.

Dielectric layer 620 is then formed over the top spacer layer 610, hard mask 150, and top portions of the previously-exposed fins 120. Dielectric layer 620 may include silicon dioxide, silicon nitride, silicon oxynitride or combinations thereof. In particular embodiments, dielectric layer 620 includes a layer of silicon dioxide and a layer of silicon nitride. For example, the dielectric layer 620 may include a layer of silicon nitride formed directly over the top spacer 610, and a fill layer of silicon dioxide formed directly over the layer of silicon nitride. The silicon nitride/silicon dioxide architecture of the example dielectric layer 620 facilitates its removal during subsequent processing.

The dielectric layer 620 may be self-planarizing, or the top surface of the dielectric layer 620 can be planarized, for example, by chemical mechanical polishing (CMP). Chemical mechanical polishing (CMP) is a material removal process that uses both chemical reactions and mechanical forces to remove material and planarize a surface. Patterned hard mask 150 may function as a CMP stop layer during planarization of the dielectric layer 620.

Figure 11:
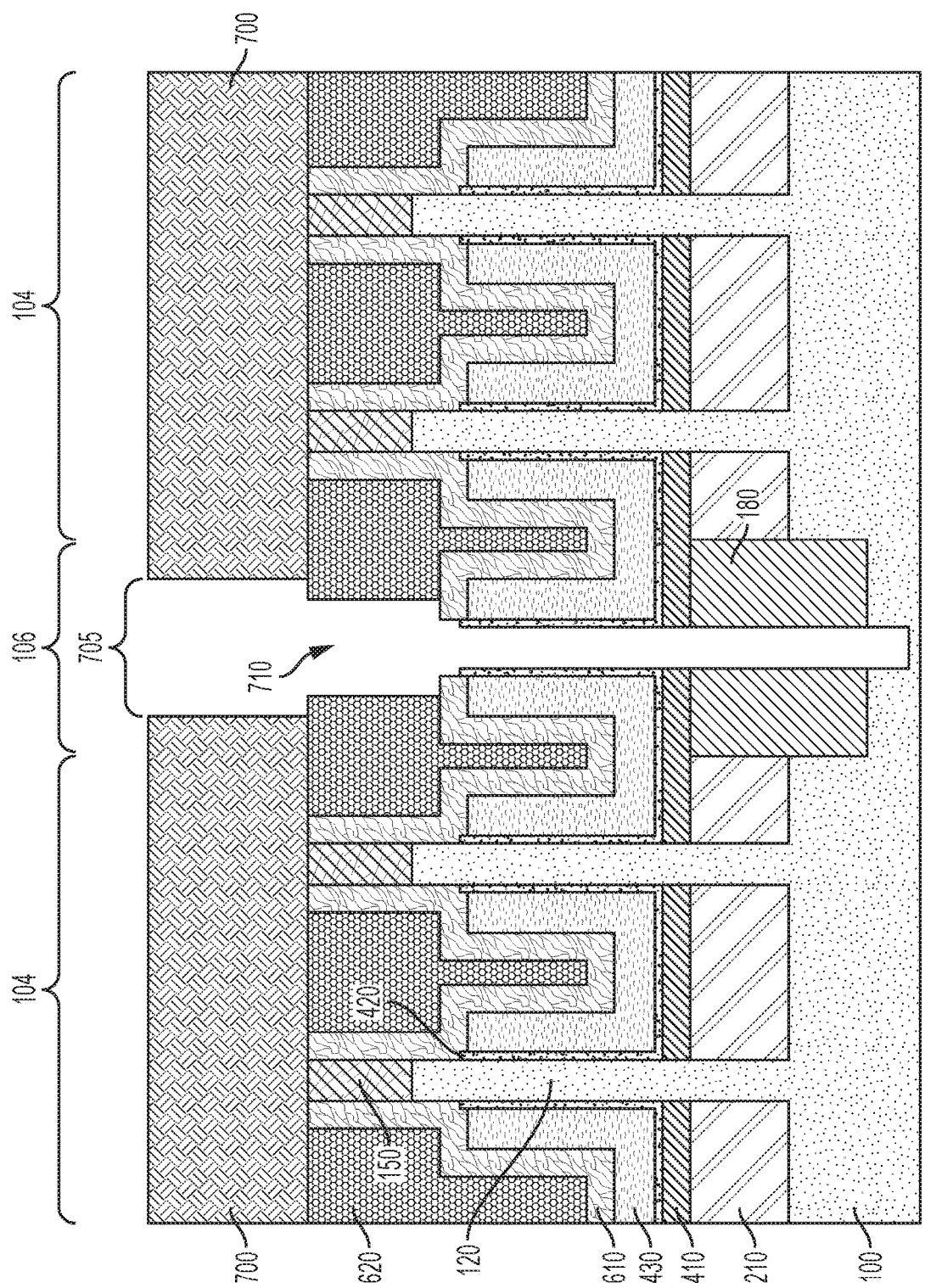
FIG. 11 depicts the formation of a second block mask over the active regions of the substrate and the removal of an inactive fin to form a second isolation trench.

Referring to FIG. 11, a block mask layer is formed over the structure of FIG. 10 and lithographically patterned to form a second block mask 700 that overlies fins within the active regions 104. Sacrificial fins 120 within the isolation region 106 are exposed through opening 705 in the second block mask 700.

Fins 120 or portions thereof not covered by the second block mask 700 are removed using a selective etch that forms a trench 710 within isolation region 106. In the illustrated embodiment, the fin cut etch removes the fin 120 as well as the bottom source/drain region 210 and a portion of the semiconductor substrate 100 that underlie the fin within isolation region 106. Trench 710 extends into semiconductor substrate 100 such that a bottom surface of the trench 710 is disposed below a bottom surface of shallow trench isolation 180.

Figure 12:
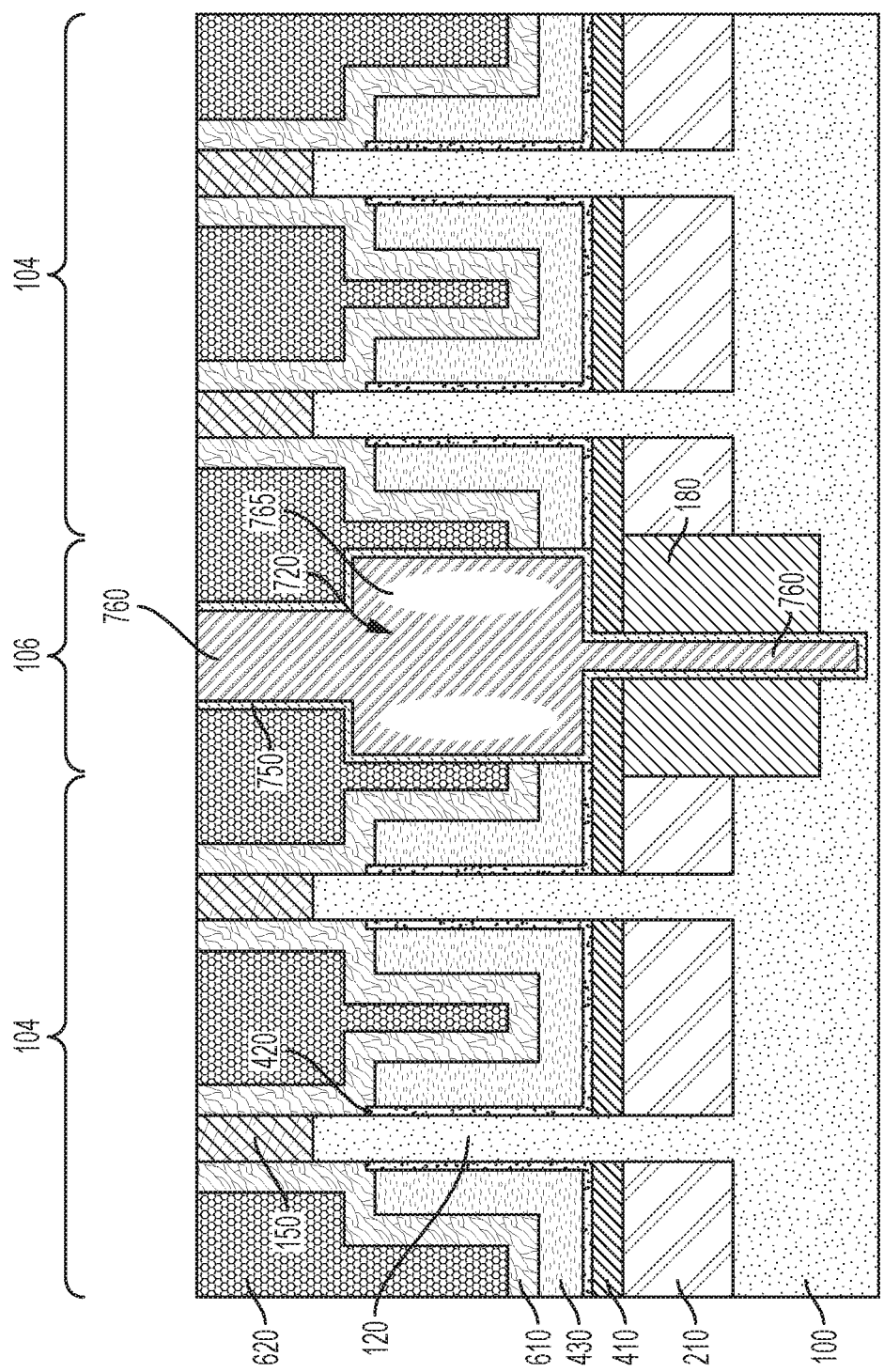
FIG. 12 shows widening of an intermediate portion of the second isolation trench and the deposition therein of a dielectric liner and a dielectric fill layer.

Referring to FIG. 12, a further etching step is used to widen trench 710 and form a cavity 720 that is back-filled with a dielectric material. That is, portions of gate dielectric layer 420, gate conductor layer 430, and top spacer 610 exposed within the trench 710 within isolation region 106 are etched selectively with respect to the bottom spacer 410 and the dielectric layer 620. A lateral etch of the gate dielectric layer 420, gate conductor layer 430 and top spacer 610 forms cavity 720 that underlies dielectric layer 620. Thereafter, the second block mask 700 is removed and an isolation dielectric layer 760 is formed within both the trench 710 and the cavity 720.

As shown in FIG. 12, prior to formation of the isolation dielectric layer 760, a dielectric liner 750 may be formed over exposed surfaces within the trench 710 and the cavity 720. In certain embodiments, the dielectric liner 750 is adapted to inhibit direct contact between the isolation dielectric layer 760 and the gate dielectric 420. The dielectric liner 750 may include a nitride material such as silicon nitride. Isolation dielectric layer 760 may include silicon dioxide, for example.

In the illustrated embodiment, the nitride liner 750 is disposed over vertical surfaces of each of the dielectric layer 620, the top spacer 610, the gate stack 420, 430 and the bottom spacer 410, and over horizontal surfaces of each of the dielectric layer 620 and the bottom spacer 410.

During deposition of the isolation dielectric layer 760, the dielectric layer material may impinge upon sidewalls of trench 710 within upper regions thereof, i.e., above cavity 720, and pinch-off prior to completely filling cavity 720, resulting in the formation of one or more air-gaps 765 within the cavity 720. Following deposition of the isolation dielectric layer 760, shallow trench isolation 180, dielectric liner 750, isolation dielectric layer 760, air-gaps 765 (if formed) and dielectric layer 620 within isolation region 106 cooperate to form an isolation architecture between adjacent active regions 104.

According to various embodiments, isolation dielectric layer 760 extends from above the top surface of the fins within the active regions 104 to below the bottom surface of the fins within the active regions 104. Air-gaps 765, if present, extend from below the top surface of the fins within the active regions 104 to above the bottom surface of the fins within the active regions 104. The dielectric liner 750, isolation dielectric layer 760, and optional air-gaps 765 together form at least part of an isolation structure that is laterally offset from, i.e., between, the remaining fins. The isolation structure includes a middle portion, i.e., above the bottom spacer 410 having a first width, as well as lower and upper portions having respective second and third widths that are each less than the first width.

Figure 13:
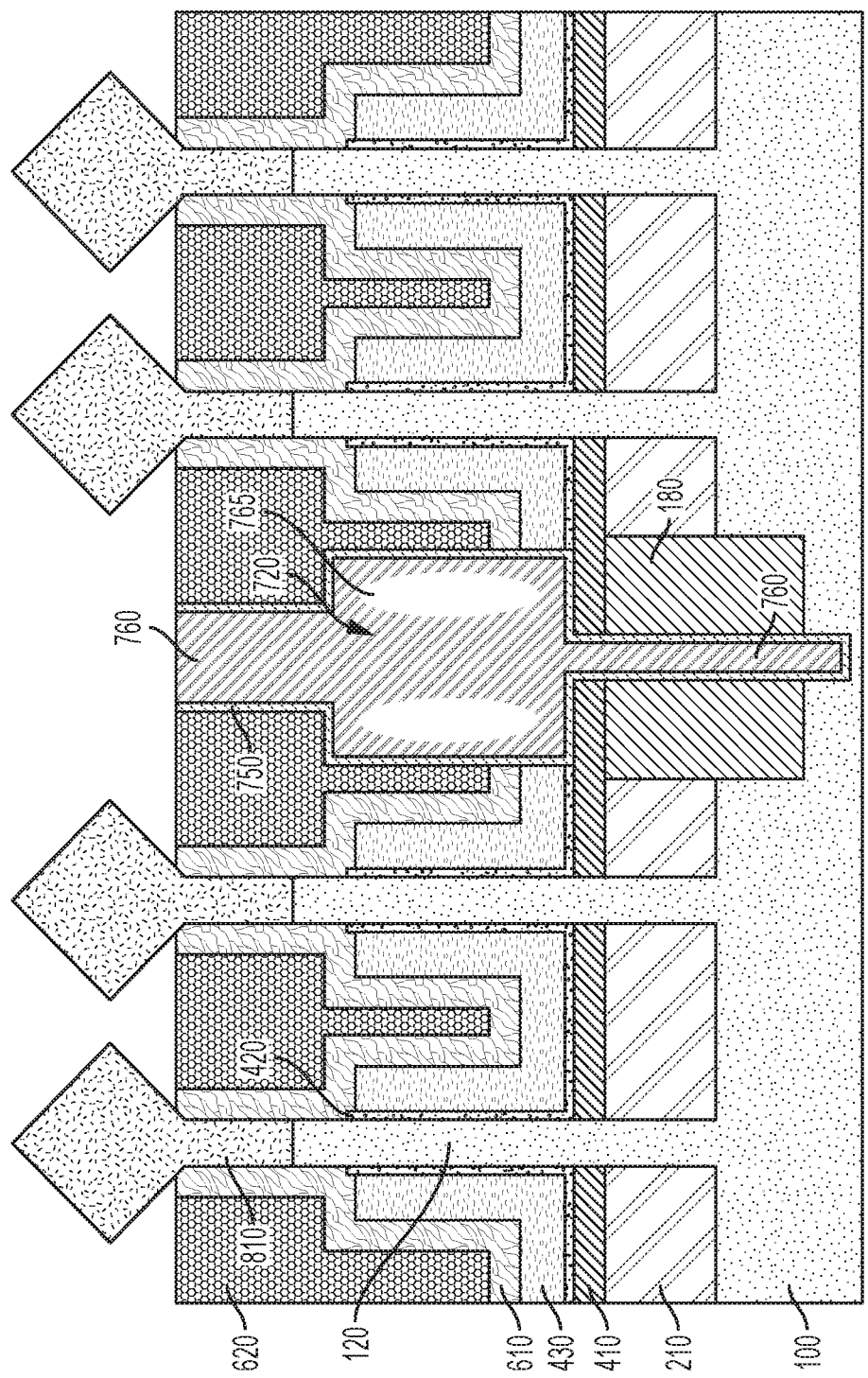
FIG. 13 shows the formation of top source/drain regions over the active fins.

Following removal of hard mask 150 to expose top surfaces of fins 120 with active regions 104, FIG. 13 depicts the formation of top source/drain regions 810 over the fins 120. Top source/drain regions 810 may be formed by selective epitaxial growth from exposed portions of the semiconductor fins. Top source/drain regions 810 may include silicon, silicon germanium, or another suitable semiconductor material. The materials and methods described above with respect to bottoms source/drain regions 210 may be used to form top source/drain regions 810.

The selective epitaxy process deposits an epitaxial layer directly onto the exposed surfaces of the fins adjacent to the top spacer 610. Exposed surfaces of the fins may include the top surface as well as upper portions of the sidewalls of the fins proximate to the top surface. In various embodiments, a silicon epitaxial layer is formed without deposition of silicon on the exposed dielectric surfaces. Selective epitaxial layers may be formed using molecular beam epitaxy or chemical vapor deposition processes that are adapted for selective epitaxy.

In various embodiments, the dopant type and dopant concentration with the top source/drain regions 810 may be the same as the dopant type and dopant concentration within the bottom source/drain regions 210.

Illustrated in FIGS. 1-13 is a fin cut last methodology for forming a vertical FinFET. The vertical transistor architecture includes one or more fins connecting a source region with a drain region. Following the formation of a functional gate, a selective etch is used to remove a sacrificial fin from within an isolation region of the device architecture. A further etching step can be used to remove a portion of the gate stack proximate to the sacrificial fin to create an isolation trench and a laterally-extending cavity that are back-filled with an isolation dielectric.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric layer that comprises or includes silicon nitride include embodiments where a dielectric layer consists essentially of silicon nitride and embodiments where a dielectric layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A vertical FinFET structure, comprising:
    a pair of fins disposed over a semiconductor substrate;
    a bottom source/drain region disposed over the semiconductor substrate, where a lower portion of each fins is in contact with the bottom source/drain region;
    a bottom spacer disposed over the bottom source/drain region;
    a gate stack disposed over sidewalls of the fins, the gate stack extending laterally over the bottom spacer on opposing sides of each fin;
    a top spacer disposed over the gate stack;
    a first dielectric layer disposed over the top spacer;
    a top source/drain region disposed over an upper portion of each of the fins; and
    an isolation structure comprising an isolation dielectric layer disposed between the pair of fins, wherein the isolation structure includes a lower portion having a first width that extends vertically through the bottom spacer into the substrate and between the bottom source/drain region of each fin, and a middle portion above a bottom portion, wherein the middle portion extends laterally over the bottom spacer and has a second width greater than the first width.

2. The vertical FinFET structure of claim 1, wherein the gate stack and the top spacer are disposed between each fin and the middle portion of the isolation structure.

3. The vertical FinFET structure of claim 1, wherein the isolation structure comprises a nitride liner disposed between the isolation dielectric layer and each of the top spacer and the bottom spacer.

4. The vertical FinFET structure of claim 3, wherein the nitride liner is disposed over respective vertical surfaces of the first dielectric layer, the top spacer and the bottom spacer.

5. The vertical FinFET structure of claim 1, further comprising a shallow trench isolation layer disposed within the semiconductor substrate beneath the middle portion of the isolation structure.

6. The vertical FinFET structure of claim 5, wherein the lower portion of the isolation structure extends completely through the shallow trench isolation layer.

7. The vertical FinFET structure of claim 5, wherein the first dielectric layer, the isolation dielectric layer and the shallow trench isolation layer each comprise silicon dioxide.

8. The vertical FinFET structure of claim 1, wherein the middle portion of the isolation structure comprises an air-gap.

9. The vertical FinFET structure of claim 1, wherein the isolation structure further comprises a top portion above the middle portion having a third width less than the second width.

10. A vertical field effect transistor (FET) structure, comprising:
a pair of active semiconductor regions disposed over a semiconductor substrate;
a bottom source/drain region disposed over the semiconductor substrate, where a lower portion of each active semiconductor region is in contact with the bottom source/drain region;
a bottom spacer disposed over the bottom source/drain region;
a gate stack disposed over sidewalls of the active semiconductor regions, the gate stack extending laterally over the bottom spacer on opposing sides of each active semiconductor region;
a top spacer disposed over the gate stack;
a first dielectric layer disposed over the top spacer;
a top source/drain region disposed over an upper portion of each of the active semiconductor regions; and
an isolation structure comprising an isolation dielectric layer disposed between the pair of active semiconductor regions, wherein the isolation structure includes a lower portion having a first width that extends vertically through the bottom spacer into the substrate and between the bottom source/drain region of each active semiconductor region, and a middle portion above a bottom portion, wherein the middle portion extends laterally over the bottom spacer and has a second width greater than the first width.

11. The vertical FET structure of claim 10, further comprising a shallow trench isolation layer disposed within the semiconductor substrate beneath the middle portion of the isolation structure.

12. A vertical field effect transistor (FET) structure, comprising:
a pair of active semiconductor regions disposed over a semiconductor substrate;
a bottom source/drain region disposed over the semiconductor substrate, where a lower portion of each active semiconductor region is in contact with the bottom source/drain region;
a bottom spacer disposed over the bottom source/drain region;
a gate stack disposed over sidewalls of the active semiconductor regions, the gate stack extending laterally over the bottom spacer on opposing sides of each active semiconductor region,
a top spacer disposed over the gate stack;
a first dielectric layer disposed over the top spacer;
a top source/drain region disposed over an upper portion of each of the active semiconductor regions;
a nitride liner disposed between the isolation dielectric layer and each of the top spacer and the bottom spacer, and between the pair of active semiconductor regions, wherein the nitride liner includes a lower portion having a first width that extends vertically through the bottom spacer into the substrate and between the bottom source/drain region of each active semiconductor region, and a middle portion above the bottom portion, wherein the middle portion extends laterally over the bottom spacer and has a second width greater than the first width; and
a shallow trench isolation layer disposed within the semiconductor substrate beneath the middle portion of the isolation structure.

13. The vertical FET structure of claim 12, wherein the nitride liner is disposed over respective vertical surfaces of the first dielectric layer, the top spacer and the bottom spacer.

14. The vertical FET structure of claim 12, wherein the lower portion of the nitride liner extends completely through the shallow trench isolation layer.

15. The vertical FET structure of claim 12, wherein the middle portion of the nitride liner includes an air-gap.

16. The vertical FET structure of claim 12, wherein the nitride liner further comprises a top portion above the middle portion having a third width less than the second width.

* * * * *